United States Patent [19]

Gluck

[11] Patent Number: 5,234,860
[45] Date of Patent: Aug. 10, 1993

[54] THINNING OF IMAGING DEVICE PROCESSED WAFERS

[75] Inventor: Ronald M. Gluck, Rochester, N.Y.

[73] Assignee: Eastman Kodak Company, Rochester, N.Y.

[21] Appl. No.: 855,353

[22] Filed: Mar. 19, 1992

[51] Int. Cl.⁵ .................................... H01L 21/302
[52] U.S. Cl. ................................. 437/63; 437/3; 437/53; 437/225; 437/974; 437/231; 148/DIG. 12
[58] Field of Search ............... 437/63, 231, 3, 5, 974, 437/982, 225, 53; 148/DIG. 12, DIG. 135, DIG. 133

[56] References Cited

U.S. PATENT DOCUMENTS

| | | |
|---|---|---|
| 4,266,334 | 5/1981 | Edwards et al. |
| 4,321,613 | 3/1982 | Hughes et al. ............... 437/974 |
| 4,472,875 | 9/1984 | Christian et al. ............. 437/203 |
| 4,599,792 | 7/1986 | Cade et al. ............. 148/DIG. 135 |
| 4,608,749 | 9/1986 | Harada et al. ................. 437/3 |
| 4,772,565 | 9/1988 | Kamimura et al. ............. 437/4 |
| 4,784,970 | 11/1988 | Solomon ..................... 437/974 |
| 4,840,918 | 6/1989 | Sheu et al. ..................... 437/2 |
| 4,879,258 | 11/1989 | Fisher. |
| 4,962,063 | 10/1990 | Maydan et al. ............... 437/982 |
| 4,968,628 | 11/1990 | Delgado et al. |
| 4,980,308 | 12/1990 | Hayashi et al. ............... 437/974 |
| 4,983,251 | 1/1991 | Haisma et al. |

OTHER PUBLICATIONS

Huang et al; A new process for thinned, back-illuminated CCD imager devices; 1989; pp. 98–101; International Symposium on VLSI Tech. and Applications.
Lasky, Applied Physics Letters 48(1) (1986); pp. 78–80; Wafer bonding for silicon on insulator technologies.
Shimbo et al, J. Applied Physics 60(8) 1986; pp. 2987–2989; Silicon to Silicon direct bonding method.
Masazara et al, J. Applied Physics 64(10) 1988; pp. 4943–4950; Bonding of Silicon Wafers on Silicon on insulator.
Baumagart et al., 177th Electrochemical Society Mtg. 90-1, 460–461 (1990); Origin of Residual Defects in bonding and etch back silicon on insulator technology.
Ito et al. J. Electrochemical Society, vol. 137 No. 4, (1990); pp. 1212–1218; Application of surface reformed thick SOG to MOS device planarization.
VMIC Conference Jun. 12–13, 1990, p. 89; Renteln et al. pp. 57–63; Characterization of Mechanical Planarization Process.
Marks et al, VMIC Conference, Jun. 12–13, 1989, pp. 89–95; In Situ planarization of dielectric surfaces using boron oxide.
Davari et al; IEDM Technical Digest (1989); pp. 61–64; A new planarization tech. using a combination of RIE and CMP.

Primary Examiner—Brian E. Hearn
Assistant Examiner—Michael Trinh
Attorney, Agent, or Firm—Raymond L. Owens

[57] ABSTRACT

A process for supporting an image sensor wafer includes providing a support oxide layer on one surface of a support wafer and an etch resistant layer on the opposite surface. The support oxide layer is bonded to the image sensor oxide layer.

5 Claims, 6 Drawing Sheets

THINNING OF IMAGING DEVICE PROCESSED WAFERS

FIELD OF THE INVENTION

The present invention relates to thinning semiconductor wafers.

BACKGROUND OF THE INVENTION

Backside thinning of image sensors is commonly used to increase their quantum efficiency and spectral range. Thinning of image sensors frequently involves bonding of the device wafers to a support wafer. See Huang et al, International Symposium on VLSI Technology and Applications, Abstract 3-3 (1989), Blouke et al, Optical Engineering, Vol. 26, No. 9,837 (1987), U.S. Pat. No. 4,266,334 to Edwards et al, issued May 12, 1981 and Hamaguchi et al, Japanese Journal of Applied Physics, Vol. 23, No. 10, L815-L817 (1984). Epoxy adhesives are used as bonding agents. A high temperature epoxy used for this application, Epotek, Epoxy Technology Inc., Billerica, MA, specifies a maximum operating temperature of 160° C. This severely limits the type of thermal processing to which these epoxy bonded composites can be subjected. Specifically, post metalization sintering at 450° C. is not feasible.

It has been found that imager device wafers are subjected to a net compressive stress during their fabrication which results in a typical wafer bow of 25 micrometers on a 4 inch diameter wafer. In order to effectively bond these wafers to a support wafer with a uniform bond thickness, it is necessary to bow match the device wafer to the support wafer. This requires a process to induce the correct bow on the support wafer. In practice silicon nitride layers of a specified thickness are deposited on the support wafer and then etched off one side of the support wafer to achieve a net stress. This requires extra process steps and considerable metrology as well.

Bonding of silicon wafers by contacting of hydrophilic oxidized surface layers has been studied. See Lasky, Applied Physics Letters, 48(1), (1986) and Shimbo et al, J. Applied Physics, 60(8), 1986. Recently, the technique has been developed in connection with silicon on insulator processing. See Masazara et al, J. Applied Physics, 64(10), (1988), Abe et al, Abs #291, 177th Electrochemical Society Mtg. 90-1, 460, (1990), Lehmann et al, Abs #306, 177th Electrochemical Society Mtg. 90-1, 457 (1990), Yamada et al, Abs #307, 177th Electrochemical Society Mtg., 90-1, 458 (1990) and Baumagart et al, Abs #308, 177th Electrochemical Society Mtg., 90-1, 460 (1990). U.S. Pat. No. 4,983,251 discloses that device wafers can be multiply planarized and bonded to oxide surfaces to form 3-dimensional stacked integrated circuits. This bonding method involves the joining of two silicon wafers with hydrated oxide surfaces. These surface layers must have OH-groups which create the surface attraction through hydrogen bonding during the initial wafer contact. On subsequent heating, Si—O—Si bond units form at temperatures of 300° C. or higher, increasing overall bonding strength. In order to prevent voids in the bonded surfaces, the wafers must be smooth and free of particulate contamination. Surface roughness associated with integrated circuit device topography would form voids or prevent wafer bonding, even though surface OH-groups were present, because of limited surface contact area.

Wafer planarization processes have been developed to smooth device topography primarily for multilevel metal interconnections. The use of spin-on-glass (SOG) as a planarization medium is disclosed in Ito et al, J. Electrochemical Society, Vol. 137, no. 4, 1212 (1990). SOG has been used as a planarization media for device fabrication. See U.S. Pat. No. 4,968,628, Nov. 6, 1990. SOG materials are silicon containing organic compounds which are applied to wafers by spin coating. They are cured by heating, at which time they undergo a polymerization reaction in which molecules are joined with Si—O—Si bridges. There are many varieties of SOG with different organic constituents which affect their physical properties such as viscosity, hardness after curing and resistance to cracking. Generally, SOG materials called polysiloxanes have high organic content, can be coated in thicker layers and have less tendency to crack after curing. They have higher planarization capacity per coating and will therefore planarize device topography with fewer coating levels.

Planarization of oxidized silicon surfaces on a wafer scale basis has been disclosed as using a chemi-mechanical polishing process. See Rentein et al, VMIC Conference, Jun. 12-13, 1990, p. 57 (1990). U.S. Pat. No. 4,879,258 teaches that chemi-mechanical polishing can be used to planarize wafer during device fabrication. See Marks et al, VMIC Conference, Jun. 12-13, 1990, p. 89. Planarization of dielectric surfaces using boron oxide is also known. Ibid. See also U.S. Pat. No. 4,962,063. In this application boron oxide is deposited over the dielectric material and is observed to flow to effect a planarized surface. Subsequently, the boron oxide is etched away using a 1:1 dielectric to boron oxide etch.

Planarization of dielectric surfaces using the resist etchback process is similar to the boron oxide process except that the dielectric surface is planarized with photoresist. Following the planarization, the photoresist is removed with a plasma process that etches the resist and underlying dielectric at the same rate, thereby resulting in a topography which approximates the photoresist but is composed of dielectric.

This resist etchback process is reviewed by G. C. Schwartz in "Reliability of Semiconductor Devices and Interconnection and Multilevel Metallization, Interconnection, and Contact Technologies," H. Rathore, G. C. Schwartz and R. Susko, Editors, pages 310-347, The Electrochemical Society Softbound Proceedings Series, Pennington, N.J. (1989). Davari et al, IEDM Technical Digest, p. 61, 1989 reports improved planarization using in sequence a resist etchback

SUMMARY OF THE INVENTION

This invention involves a process for supporting an image sensor wafer the bottom surface of which is to be thinned by etching, having at least partially formed image sensor structures, comprising the steps of:

(a) forming a planarized oxide layer on the top surface of the image sensor wafer;

(b) providing a support oxide layer on one surface of a support wafer and an etch resistant layer on the opposite surface; and (c) bonding the support oxide layer to the image sensor oxide layer whereby the image sensor wafer is supported.

This oxide bonded composite has several advantages over conventional epoxy bonded composites. The oxide bond can withstand high processing temperatures and the bond strength is improved at increased temperatures. The processing temperature is normally limited by some of the materials used in fabricating the image sensor wafer rather than the bonding agent. In contrast, the epoxy bond is temperature limited to about 160° C., above which organic decomposition is initiated. The epoxy bonded composite cannot be annealed to reduce many types of processing defects. Oxide bonded wafers have the additional advantage of being bond insensitive to wafer bow and warp, while epoxy bonded composites are very sensitive to wafer bow and warp. In order to minimize epoxy bond thickness variation the two wafers need to be bow matched. The attractive forces associated with oxide bonding overcome the stress forces associated with bow and warpage which are commonly found on fabricated device wafers.

DETAILED DESCRIPTION

Figure 1:
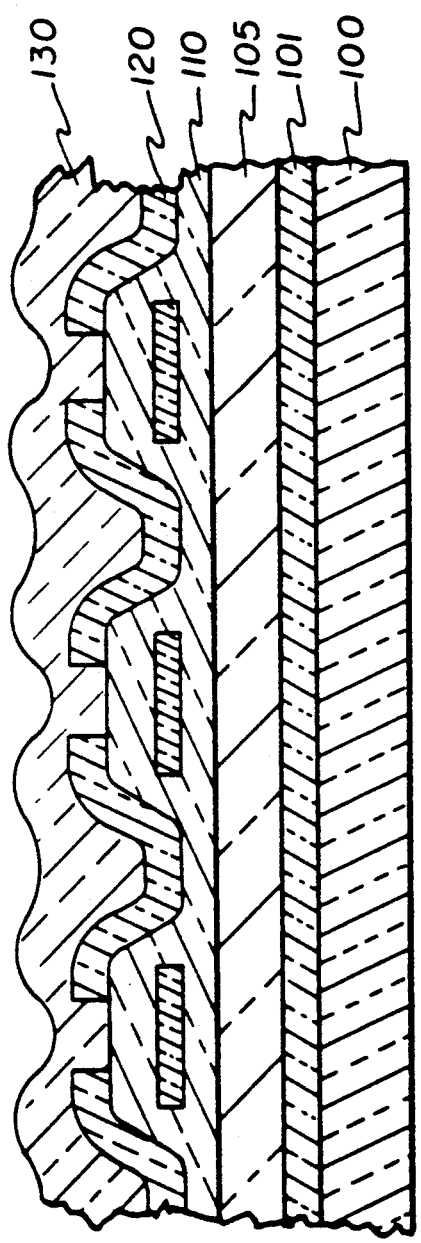
FIGS. 1–7 shows several steps by which the active or first surface of a silicon image sensor wafer or device wafer is planarized to form a planar oxide surface thereon which is bonded to a first planar oxide surface of a silicon support wafer by oxide bonding.
Figure 5:
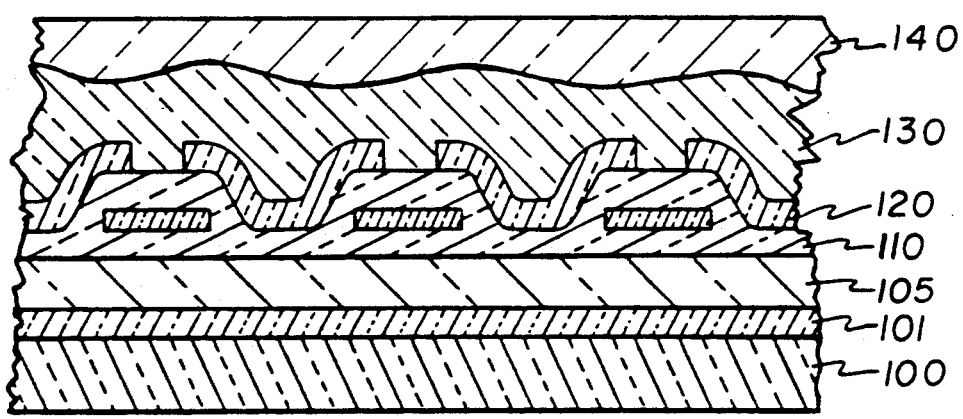

In FIG. 1, a schematic cross-section of an imaging device (part of one image sensor on a silicon device wafer having a plurality of image sensors) shown containing CVD oxide passivation layer 130 (constituting the active or first surface of the image sensor wafer), dual levels of polysilicon electrodes 120, thermal oxide gate dielectric 110, and epitaxial silicon 105. The backside of the image sensor wafer, i.e., the bulk silicon 100 (also called the wafer substrate) farthest opposite said first surface, 100 has been overcoated with an etch stop layer 101 required for subsequent thinning. The method chosen as a detailed example of planarization technology for this application is spin-on-glass (SDG). The device topography is planarized in FIG. 2 by use of SOG layer 140. Depending on the extent of topography, successive coatings of SOG may be required. It is necessary to cure the SOG layers between coatings with a heat treatment. A preferred SOG material is Accuglass 311 (Allied Chemicals) and spin coating conditions are 3000 RPM for 20 seconds. Initial curing is on a hot plate at 150° C. for 60 seconds. Additional curing is at 450° C. for 30 minutes in an $N_2$ ambient. Three successive cycles of application and curing give best planarization without cracking. Depending on device design, the degree of planarization achievable by SOG may or may not be sufficient for oxide bonding. If it is insufficient, an additional planarization step shown in FIG. 5 can be performed. Wafer substrate 100 is temporarily bonded to a polishing plate using an adhesive such as crystal bond heated to 100° C. Upon cooling, the surface of layer 140 is subjected to a chemi-mechanical polishing operation in which several thousand angstroms of layer 140 are removed. Preferred polishing materials are WS-1000 (NALCO) polishing slurry and IC-60 (RODEL) polish pad. The polishing pressure is 5-7 PSI and an average pad velocity of 14 inches per sec is maintained. After polishing layer 140 to be substantially planarized, wafer substrate 100 is removed from the polishing plate with acetone, which dissolves the crystalbond adhesive.

Figure 2:
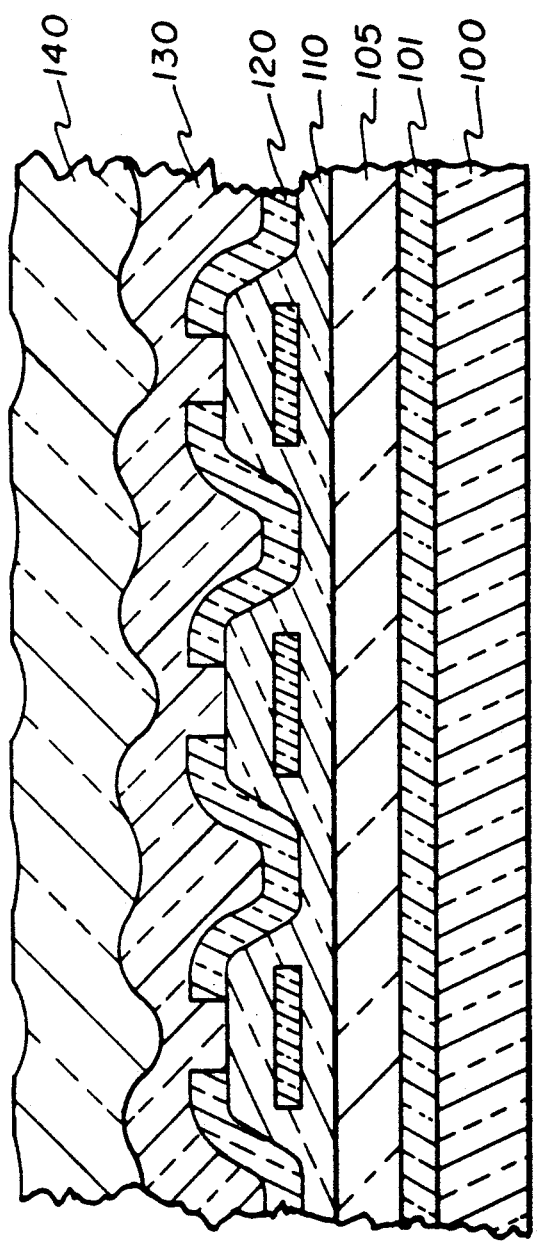
Figure 3:
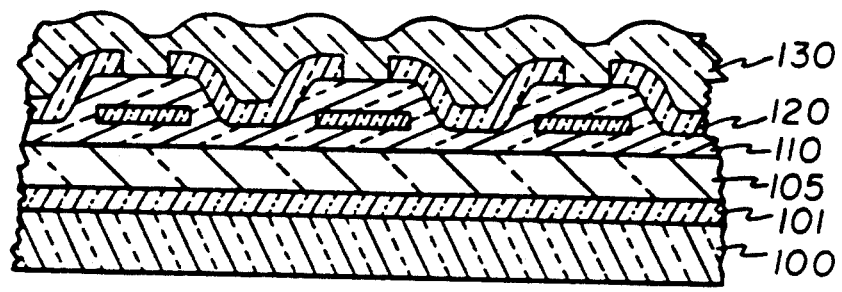
Figure 4:
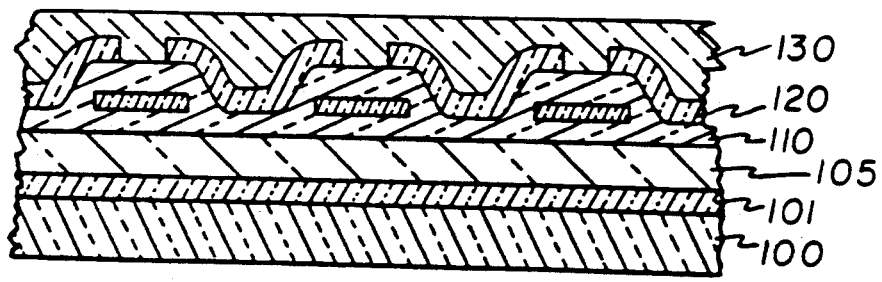

The device topography can also be smoothed as shown in FIG. 2 by the application of other planarization materials 140 such as boron oxide or photoresist. This results in a smoothed surface which may retain reduced topographical features, the extent of which is a complex function of the underlying device topography. When using boron oxide or photoresist as planarization materials, a plasma etch process with 1:1 selectivity to silicon oxide is used to etch away the boron oxide or photoresists, stopping in CVD oxide passivation layer 130. This results in a topography as shown in FIG. 4 in which the smoothed surface obtained with the planarization material is reproduced on the CVD oxide passivation surface. Depending on device design, the degree of planarization may or may not be sufficient for oxide bonding. If it is insufficient, an additional planarization step as shown in FIG. 4 can be performed. Wafer substrate 100 is temporarily bonded to a polishing plate using an adhesive such as crystalbond heated to 100° C. upon coating, the surface of layer 130 is subjected to a chemi-mechanical polishing operation in which several thousand angstroms of layer 130 are removed. Preferred polishing materials are WS-1000 (Nalco) polishing slurry and IC-60 (Rodel) polish pad. The polishing pressure is 5-7 psi and an average pad velocity of 14 inches per sec is maintained. After polishing layer 130 to be substantially planarized, wafer substrate 100 is removed from the polishing plate with acetone, which dissolves the crystalbond adhesive.

Figure 6:
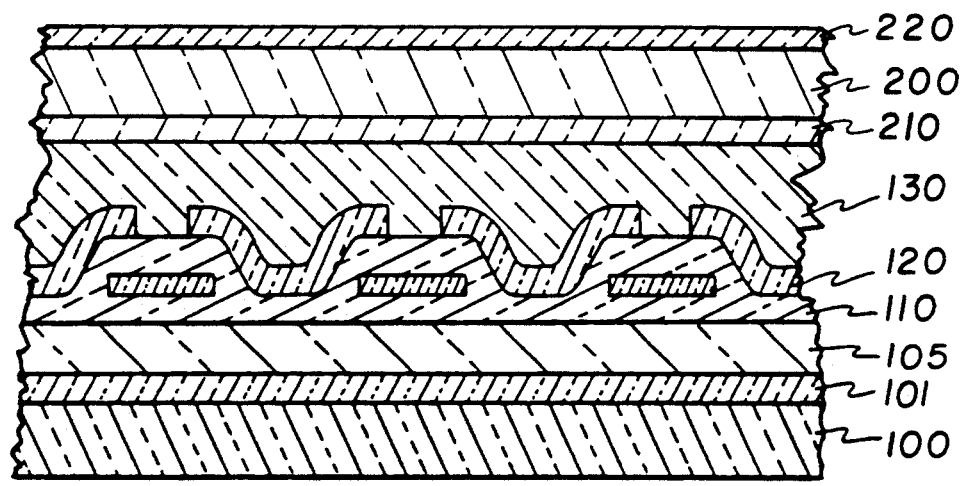
Figure 7:
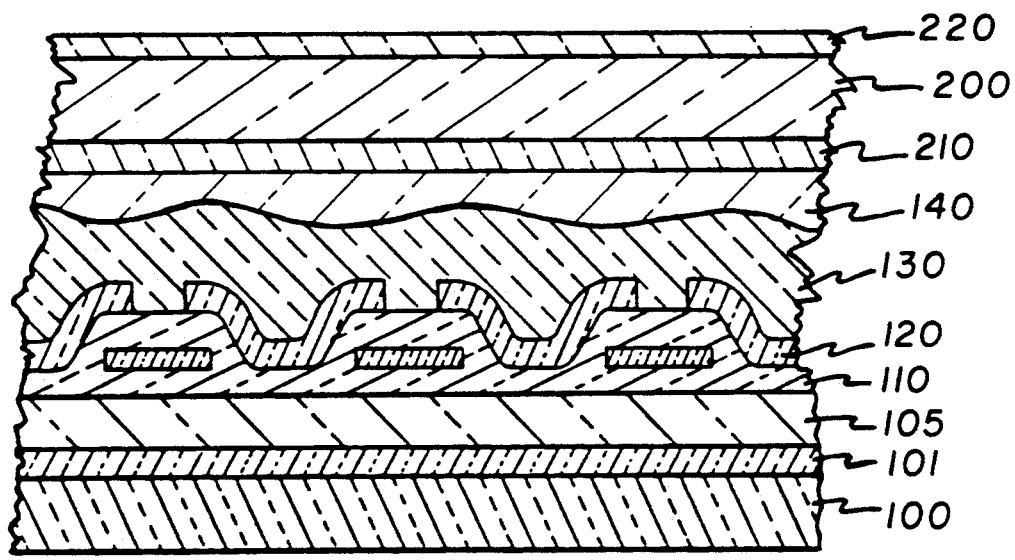

At this stage, the device substrate 100 is ready for bonding to the support wafer 200 which is coated with silicon nitride 220 on one side and thermal oxide 210 on the other (see FIGS. 6 and 7). Surface layers 210 and 130 or 140 must be free of particles and must be hydrated prior to bonding. Surface cleaning methods such as ultrasonic agitation in aqueous detergent solutions are useful to remove polishing slurry residue from device wafer 100. Chemical cleaning with hot, dilute aqueous mixtures of low particulate hydrogen peroxide and ammonium hydroxide serves to remove organic contaminants and to hydrate the surfaces to be bonded. Before contacting the wafers, they should be aligned such that the wafer flats as well as peripheral regions coincide. This can be accomplished by providing a mold of the exact wafer shape and dimension into which both wafers can be stacked. Bonding is initiated by momentary application of a point source of pressure at one edge. Following the initial contacting, the wafers should be subjected to heat treatment to increase bond strength. This bond strength generally increases with increasing temperature but not substantially with increased time, between 10 and 2500 seconds. The temperature limitation is usually the melting or reaction temperature associated with a device material. This is commonly aluminum metalization which is limited to 450° C.

The bonded wafers are now suitable for thinning of the backside 100 of the image sensor wafer, using known procedures such as, for example, chemical etching and polishing procedures. In the case illustrated in FIG. 6 and FIG. 7, wafer substrate 100 will be thinned down to a layer 101 with a selective etch and further thinned to layer 105 if desired using a secondary nonselective etch. Layer 220 protects the support wafer 200 during etching.

Advantages

This oxide to-oxide bonded composite (also simply referred to as oxide bonded composite) has several advantages when compared to conventional epoxy bonded composites. The epoxy bonded composite is temperature limited to approximately 160° C. whereas the oxide bonded composite is not thermally restricted. High process temperatures are advantageous in increasing bond strength and reducing bonding voids. Oxide bonded composites can be annealed to reduce process induced defects while epoxy bonded devices cannot be so annealed. In addition, epoxy bond strength is sensitive to epoxy bond thickness and special precautions must be taken to minimize epoxy thickness variations. This includes matching of support wafer bow to device wafer bow. Oxide bonded composites are insensitive to device wafer bow since the bond strength is not dependent on oxide thickness and the attractive forces associated with bonding overcome any bow mismatch between the device wafer and support wafer in order to provide effective surface contact.

Oxide bonded composites can be heated to temperatures limited only by devices, materials and etch stop layer, so sinter anneal and backside implant anneal fabrication steps are possible, if required. Bonding is less sensitive to wafer, bow and warp so device wafer to support wafer differences are not an issue.

The invention has been described in detail with particular reference to certain preferred embodiments thereof, but it will be understood that variations and modifications can be effected within the spirit and scope of the invention.

What is claimed is:

1. A process for oxide-to-oxide bonding a first initially non-planar oxide surface of a silicon image sensor wafer having a second surface of a thinnable substrate to one oxide surface of a silicon support wafer, comprising the steps of:

(a) forming a planarized oxide over the first initially non-planar oxide surface of the image sensor wafer opposite said second surface;
   (b) providing a planarized oxide on said one surface of the support wafer and a thinning-protective surface on the second surface of the support wafer;
   (c) hydrating the planarized oxide surfaces of the image sensor wafer and the support wafer;
   (d) bonding the hydrated planarized oxide on the first surface of the image sensor wafer to the hydrated planarized oxide on the one surface of the support wafer whereby the image sensor wafer is supported; and
   (e) thinning the thinnable substrate on said second surface of said image sensor wafer.

2. The process of claim 1 wherein the step of forming the planarized oxide over the first initially non-planar oxide surface of the image sensor wafer includes providing a spin-on-glass layer over said first surface, whereby said first oxide surface of the image sensor wafer is covered by the planarized glass layer.

3. The process of claim 2 wherein the planarized glass layer is polished.

4. The process of claim 1 including bonding the hydrated planarized oxide on the first surface of the image sensor wafer to the hydrated planarized oxide on the one surface of the support wafer by means of hydrogen bonds created by providing $OH^-$ groups in each oxide in said hydrating step.

5. The process of claim 1 wherein the bonding step includes aligning the hydrated planarized oxide surfaces of the image sensor wafer and the support wafer, and applying pressure to cause hydrogen bonds to form.

* * * * *